United States Patent [19]

Bauregger

[11] Patent Number: 5,619,175
[45] Date of Patent: Apr. 8, 1997

[54] SURFACE ACOUSTIC WAVE FILTER WITH REFLECTORS AND RESISTORS

[75] Inventor: Josef Bauregger, Aying, Germany

[73] Assignee: Siemens Matsushita Components GmbH & Co. KG, Munich, Germany

[21] Appl. No.: 427,152

[22] Filed: Apr. 24, 1995

[30] Foreign Application Priority Data

Apr. 22, 1994 [DE] Germany .................. 44 14 160.2

[51] Int. Cl.⁶ .................................................. H03H 9/64
[52] U.S. Cl. ........................ 333/195; 333/150; 333/193; 333/196; 310/313 D
[58] Field of Search ............................. 333/193–196, 333/150, 153; 310/313 B, 313 D

[56] References Cited

U.S. PATENT DOCUMENTS

| | | | |
|---|---|---|---|
| 4,160,963 | 7/1979 | Hays, Jr. | 333/195 |
| 4,267,534 | 5/1981 | Tanski | 333/195 |
| 4,308,510 | 12/1981 | Yamada et al. | 333/195 |
| 4,340,834 | 7/1982 | Sato | 333/195 |
| 4,448,805 | 5/1984 | Lewis | 333/153 |
| 4,625,184 | 11/1986 | Niitsuma et al. | 333/150 |
| 4,628,222 | 12/1986 | Lewis | 333/153 |
| 5,093,638 | 3/1992 | Kinsman et al. | 333/195 |

FOREIGN PATENT DOCUMENTS

| | | |
|---|---|---|
| 4115702 | 11/1992 | Germany . |
| 4307726 | 7/1994 | Germany . |
| 0276311 | 3/1990 | Japan . |
| 3029407 | 7/1991 | Japan . |

*Primary Examiner*—Benny Lee
*Assistant Examiner*—Darius Gambino
*Attorney, Agent, or Firm*—Herbert L. Lerner; Laurence A. Greenberg

[57] ABSTRACT

A filter operating with acoustical harmonic waves includes at least one resonator being formed of an interdigital converter and reflectors. An electrical resistor is connected parallel to at least one filter component for protecting against electrostatic discharge from contact with electrostatically charged parts. The electrical resistor is integrated with one or both of the reflectors of the resonator.

3 Claims, 1 Drawing Sheet

SURFACE ACOUSTIC WAVE FILTER WITH REFLECTORS AND RESISTORS

BACKGROUND OF THE INVENTION

Field of the Invention

The present invention relates to a filter operating with acoustic harmonic waves (HW filter), having at least one resonator formed by an interdigital converter and reflectors, in which an electrical resistor is connected parallel to at least one filter component in order to protect against electrostatic discharge from contact with electrostatically charged parts.

German Patent DE 43 07 726 C states that HW filters, especially filters with fine structures, are vulnerable to electrostatic discharges, and if they contact electrostatically laden parts they can be destroyed by discharge of those parts through an interdigital converter that is contained in the filter.

In a digital converter of an HW component for protecting against electrostatic discharge from contact with electrostatically charged parts, the aforementioned German patent proposes the parallel connection of a meander-shaped electrical resistor having a resistance which is defined in such a way that the time constant, including an internal resistance and an intrinsic capacitance of the voltage source formed by an electrostatically charged part, is high as compared with the time constant including the parallel resistance and intrinsic capacitance of the interdigital converter. The parallel resistance is suitably constructed on the substrate of the filter in the form of a meander-shaped integrated resistor layer.

However, with that kind of protection provision, the problem still arises of a relatively long metal structure being needed in order to construct the protective resistor next to the component parts of the HW component.

SUMMARY OF THE INVENTION

It is accordingly an object of the invention to provide a filter operating with acoustical harmonic waves, which overcomes the hereinafore-mentioned disadvantages of the heretofore-known devices of this general type and which does so in such a way that a protective provision is accomplished in a space-saving way.

With the foregoing and other objects in view there is provided, in accordance with the invention, a filter operating with acoustical harmonic waves, comprising at least one resonator being formed of an interdigital converter component and reflector components; and an electrical resistor being connected parallel to at least one of the components for protecting against electrostatic discharge from contact with electrostatically charged parts, the electrical resistor being integrated with at least one of the reflectors of the resonator.

In accordance with another feature of the invention, the electrical resistor is formed of at least two parallel-connected meandering structures.

In accordance with a concomitant feature of the invention, there are provided transverse webs connecting the meandering structures in parallel.

Other features which are considered as characteristic for the invention are set forth in the appended claims.

Although the invention is illustrated and described herein as embodied in a filter operating with acoustical harmonic waves, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
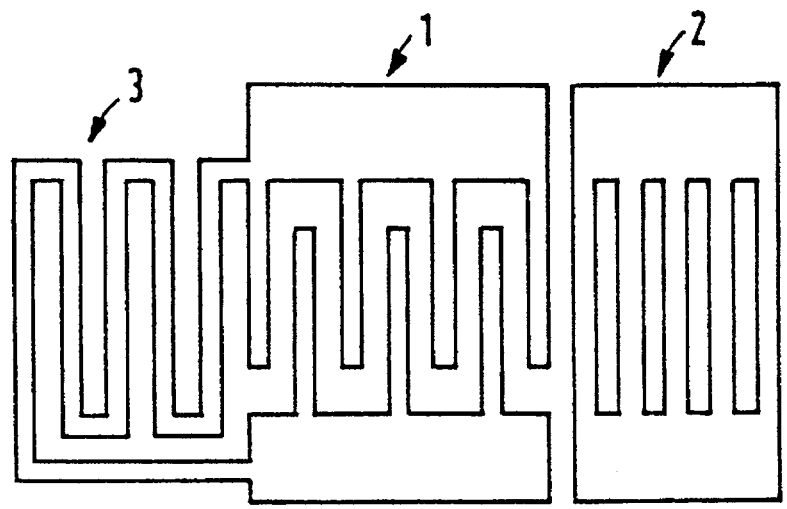
FIG. 1 is a diagrammatic view of an HW resonator with a protective resistor constructed according to the invention.

Referring now to the figures of the drawing in detail and first, particularly, to FIG. 1 thereof, there is seen a structure of a harmonic wave or HW resonator, with an interdigital converter 1 and a reflector 2 on one side of the interdigital converter 1. In a typical HW resonator, a reflector that likewise corresponds to the reflector 2 is also disposed on the side of the interdigital converter 1 remote from the reflector 2.

However, according to the invention, an electrical resistor 3 which is electrically connected to the interdigital converter 1 is integrated with this reflector or both reflectors. This meander-shaped electrical resistor 3 accordingly simultaneously acts as a reflector for acoustic harmonic waves, thereby achieving a space-saving structure of the reflector and the resistor. The protective action of this resistor 3 against electrostatic discharge, for instance from contact with electrostatically charged parts, is equivalent to the effect already described in the aforementioned German Patent DE 43 07 726 C.

Figure 2:
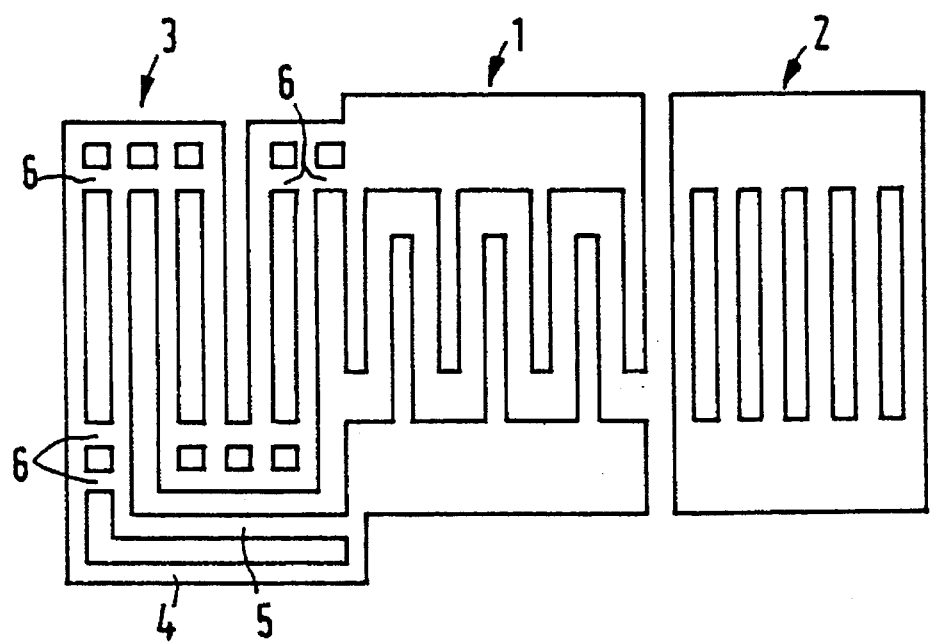
FIG. 2 is a view similar to FIG. 1 of an HW resonator with an improved meander-shaped structure of a protective resistor.

In the embodiment of FIG. 2, in which identical parts are provided with the same reference numerals as in FIG. 1, the resistor is constructed with two electrically parallel-connected meander lines or meandering structures 4, 5, and the parallel connection is brought about by crosswise webs 6. The advantage of this structure is that if there is a mechanical interruption of one of the meander lines 4, 5, or of both of the meander lines, or of the crosswise webs 6, enough conductive connections are still preserved to ensure that the electrical resistance effect is preserved virtually unchanged.

I claim:

1. A filter operating with acoustical harmonic waves, comprising:
   at least one resonator formed of an interdigital converter component and reflector components; and
   an electrical resistor connected in parallel to said interdigital converter component for protecting against electrostatic discharge from contact with electrostatically charged parts, said electrical resistor being integrated with at least one of said reflectors of said resonator.

2. The harmonic wave filter according to claim 1, wherein said electrical resistor is formed of at least two parallel-connected meandering structures.

3. The harmonic wave filter according to claim 2, including transverse webs connecting said meandering structures in parallel.

* * * * *